United States Patent
Ruhl et al.

(10) Patent No.: US 9,934,966 B2
(45) Date of Patent: Apr. 3, 2018

(54) METHOD FOR PROCESSING A CARRIER AND AN ELECTRONIC COMPONENT

(71) Applicant: Infineon Technologies AG, Neubiberg (DE)

(72) Inventors: Guenther Ruhl, Regensburg (DE); Klemens Pruegl, Regensburg (DE)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 15/189,060

(22) Filed: Jun. 22, 2016

(65) Prior Publication Data

US 2016/0307753 A1 Oct. 20, 2016

Related U.S. Application Data

(62) Division of application No. 13/921,284, filed on Jun. 19, 2013, now Pat. No. 9,449,873.

(51) Int. Cl.
| | |
|---|---|
| *H01L 21/02* | (2006.01) |
| *H01L 21/768* | (2006.01) |
| *H01L 29/66* | (2006.01) |
| *H01L 29/778* | (2006.01) |
| *H01L 29/10* | (2006.01) |
| *H01L 29/16* | (2006.01) |

(Continued)

(52) U.S. Cl.
CPC .... *H01L 21/02524* (2013.01); *H01L 21/0243* (2013.01); *H01L 21/02422* (2013.01); *H01L 21/02491* (2013.01); *H01L 21/02502* (2013.01); *H01L 21/02527* (2013.01); *H01L 21/02532* (2013.01); *H01L 21/02587* (2013.01); *H01L 21/0405* (2013.01); *H01L 21/2254* (2013.01); *H01L 21/7685* (2013.01); *H01L 29/04* (2013.01); *H01L 29/0669* (2013.01); *H01L 29/1075* (2013.01); *H01L 29/16* (2013.01); *H01L 29/1606* (2013.01); *H01L 29/167* (2013.01); *H01L 29/66037* (2013.01); *H01L 29/778* (2013.01); *H01L 29/1608* (2013.01)

(58) Field of Classification Search
CPC . H01L 21/02524; H01L 31/18; H01L 49/006; H01L 29/1606; H01L 23/49877
See application file for complete search history.

(56) References Cited

U.S. PATENT DOCUMENTS

| 8,685,843 B2 | 4/2014 | Li et al. | |
|---|---|---|---|
| 2013/0001515 A1* | 1/2013 | Li | H01L 21/0242 257/24 |

FOREIGN PATENT DOCUMENTS

| CN | 102849961 A | | 1/2013 |
|---|---|---|---|
| JP | 2007248494 A | * | 9/2007 |

* cited by examiner

*Primary Examiner* — Marc Armand
*Assistant Examiner* — Quinton Brasfield
(74) *Attorney, Agent, or Firm* — Viering, Jentschura & Partner mbB

(57) ABSTRACT

In various embodiments, a method for processing a carrier is provided. The method for processing a carrier may include: forming a first catalytic metal layer over a carrier; forming a source layer over the first catalytic metal layer; forming a second catalytic metal layer over the source layer, wherein the thickness of the second catalytic metal layer is larger than the thickness of the first catalytic metal layer; and subsequently performing an anneal to enable diffusion of the material of the source layer forming an interface layer adjacent to the surface of the carrier from the diffused material of the source layer.

18 Claims, 8 Drawing Sheets

(51) Int. Cl.
*H01L 21/04* (2006.01)
*H01L 21/225* (2006.01)
*H01L 29/04* (2006.01)
*H01L 29/06* (2006.01)
*H01L 29/167* (2006.01)

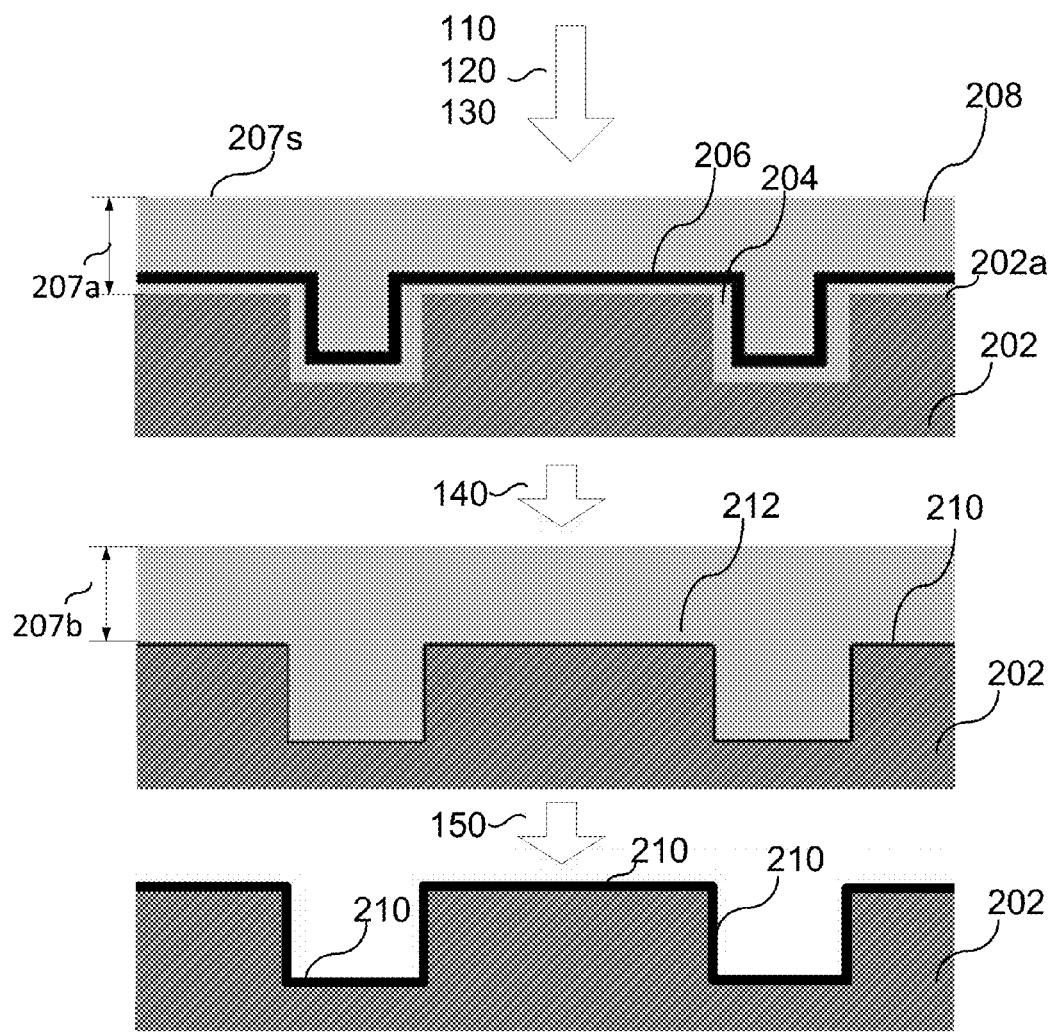

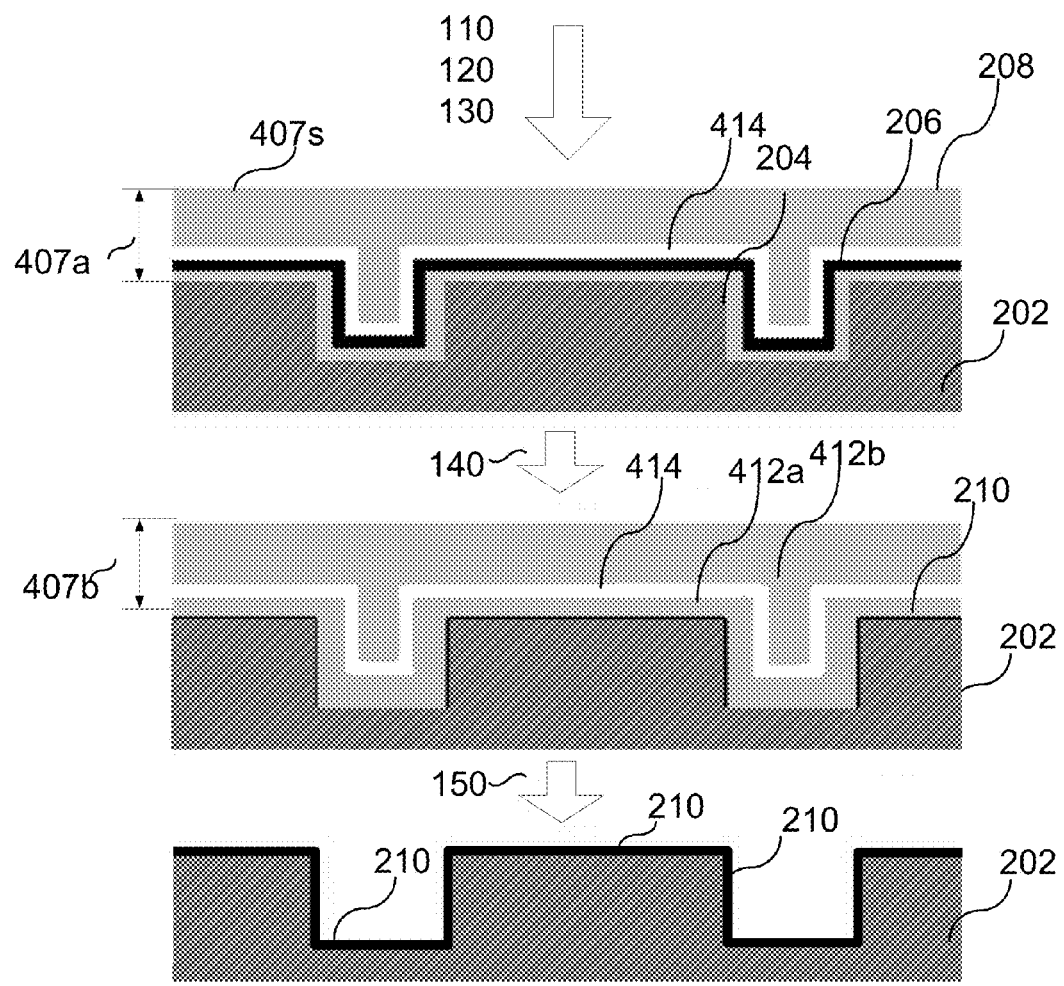

— 1 —

METHOD FOR PROCESSING A CARRIER AND AN ELECTRONIC COMPONENT

CROSS-REFERENCE TO RELATED APPLICATIONS

The present application is a divisional of U.S. patent application Ser. No. 13/921,284 filed Jun. 19, 2013, the entirety of which is herein incorporated by reference.

TECHNICAL FIELD

Various embodiments relate generally to a method for processing a carrier and to an electronic component.

BACKGROUND

In general forming a very thin layer of a material, e.g. having a layer thickness in the nanometer range or even a layer thickness smaller than one nanometer, may be very challenging using typical processes of semiconductor industry. However, so-called two-dimensional materials may be highly attractive for electronic devices and integrated circuit technologies. Graphene for example, including a layer of carbon atoms in a hexagonal arrangement, may have superior electronic properties enabling for example the manufacturing of a transistor having an increased response and/or switching behavior. Further, an ultrathin layer of a material may have enhanced properties compared to the corresponding bulk material. Therefore, two-dimensional materials could be important for microelectronics, e.g. for developing various types of sensors, transistors, and the like, wherein the challenging task may be incorporating these two-dimensional materials into a microchip for emulating the common silicon technology.

SUMMARY

In various embodiments, a method for processing a carrier is provided. The method for processing a carrier may include: forming a first catalytic metal layer over a carrier; forming a source layer over the first catalytic metal layer; forming a second catalytic metal layer over the source layer, wherein the thickness of the second catalytic metal layer is larger than the thickness of the first catalytic metal layer; and subsequently performing an anneal to enable diffusion of the material from the source layer forming an interface layer adjacent to the surface of the carrier from the diffused material of the source layer.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIGS. 5A and 5B show respectively a patterned carrier at various processing stages during the method for processing a carrier, in accordance with various embodiments.

DESCRIPTION

Figure 1:
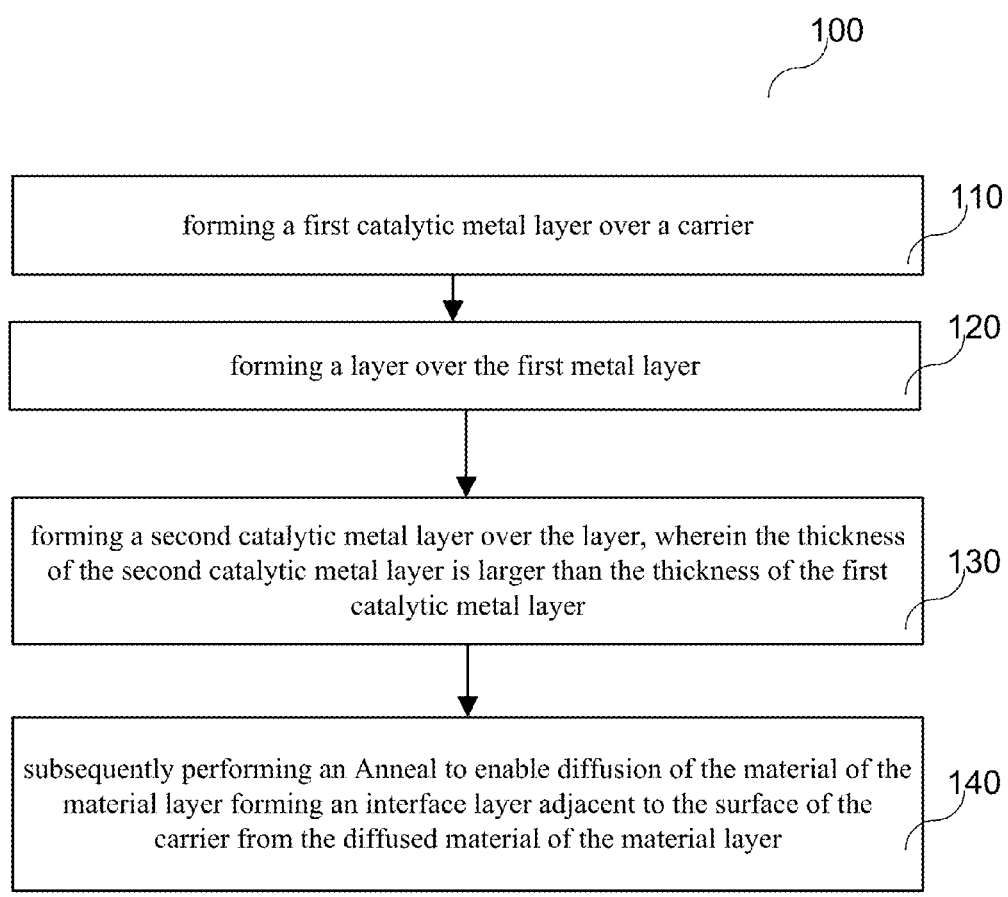
FIG. 1 shows an exemplary flow diagram of a method for processing a carrier, in accordance with various embodiments.

The following detailed description refers to the accompanying drawings that show, by way of illustration, specific details and embodiments in which the invention may be practiced.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments. Various embodiments are described in connection with methods and various embodiments are described in connection with devices. However, it may be understood that embodiments described in connection with methods may similarly apply to the devices, and vice versa.

The word "exemplary" is used herein to mean "serving as an example, instance, or illustration". Any embodiment or design described herein as "exemplary" is not necessarily to be construed as preferred or advantageous over other embodiments or designs.

The terms "at least one" and "one or more" may be understood to include any integer number greater than or equal to one, i.e. one, two, three, four, etc.

The term "a plurality" may be understood to include any integer number greater than or equal to two, i.e. two, three, four, five, etc.

The word "over", used herein to describe forming a feature, e.g. a layer "over" a side or surface, may be used to mean that the feature, e.g. the layer, may be formed "directly on", e.g. in direct contact with, the implied side or surface. The word "over", used herein to describe forming a feature, e.g. a layer "over" a side or surface, may be used to mean that the feature, e.g. the layer, may be formed "indirectly on" the implied side or surface with one or more additional layers being arranged between the implied side or surface and the formed layer.

The term "coupling" or "connection" may include both an indirect "coupling" or "connection" and a direct "coupling" or "connection".

In general, the physical and chemical properties of a material may not be defined exclusively by its crystal structure and chemical composition. Since the physical properties, for example the electronic properties (e.g. the band structure), of a surface of a material may differ from the physical properties of the bulk material, there may be a huge difference regarding the physical properties of a layer or region, if at least one spatial extension of the layer or region may be reduced in the nanometer range or even subnanometer range. In this case, the surface properties of the respective material forming the layer or region may dominate the characteristics (e.g. physical and chemical properties) of the layer or the region. In the limiting case, at least one dimension of a layer or region may have the spatial extension of several angstroms, which may be the spatial extension of exactly one monolayer of atoms of the respective material. A monolayer may be a layer having a lateral extension and a layer thickness (or height) perpendicular to the lateral extension, the layer including a plurality of atoms (or molecules), wherein the layer has a thickness (or height) of one single atom (or molecule). In other words, a monolayer of a material may not have equal atoms (or molecules) being arranged above each other (along the thickness or height direction).

According to various embodiments, there may be several different materials intrinsically forming monolayers, so called self-assembled monolayers, which may be referred to as two-dimensional materials, or more precisely as structural two-dimensional materials. Further, a typical representative of such a structural two-dimensional material may be graphene, consisting of a hexagonal two-dimensional arrangement of carbon atoms, a so-called honey-comb structure. According to various embodiments, graphene may be also referred to as a graphene sheet or a graphene layer. A further representative of a structural two-dimensional material may be hydrogenated graphene (graphane), or partially hydrogenated graphene. In pure graphene sheets, the structural arrangement and the bindings of the carbon atoms may be described using hybridization (hybrid atomic orbitals), wherein in this case the carbon atoms are $sp^2$-hybrids, which means that a covalent bonding of the carbon atoms form a hexagonal two-dimensional layer, a hexagonal monolayer. In hydrogenated graphene or graphane, the carbon atoms may be $sp^3$-hybrids or a mixture of $sp^2$-hybrids and $sp^3$-hybrids, wherein the carbon atoms being $sp^3$-hybrids are connected to a hydrogen atom, forming a sheet like (two-dimensional) structure.

A structural two-dimensional material, as referred to herein, may be a layer having covalent bonding along two spatial directions forming a sheet structure or a two-dimensional structure, e.g. self-assembled, wherein the structural two-dimensional material may not have a covalent bonding to other atoms outside the sheet structure. A structural two-dimensional material, as referred to herein, may be a layer consisting of a monolayer of a material. A structural two-dimensional material, as referred to herein, may be a layer consisting of a bilayer of a material.

Typical three-dimensional materials, e.g. metal bulk material, may have different physical and chemical properties, depending on the lateral extension of the material, e.g. a monolayer or an ultra-thin layer of a material may have different properties than a bulk of the same material. A monolayer or an ultra-thin layer of a three-dimensional material may have different properties than thicker layer of the material, since the volume to surface ratio is changing. Therefore the properties of a thin layer of a material may aspire to the bulk properties of the material for increasing layer thickness.

In contrast, a layer including a structural two-dimensional material, e.g. graphene, graphane, silicene, germanene, may retain its physical and chemical properties independently from the layer thickness, e.g. a monolayer of a structural two-dimensional material may have the same properties as a plurality of monolayers arranged above each other, since the individual layers may not be substantially coupled to each other, e.g. since there may be no covalent, ionic, and/or metallic bonding between the individual layers of a structural two-dimensional material. According to various embodiments, a plurality of graphene layers or sheets may be weakly coupled with each other (e.g. via van der Waals interaction).

A conformal layer, as described herein, may exhibit only small thickness variations along the interface with another body, e.g. the layer may exhibit only small thickness variations along edges, steps or other elements of the morphology of the interface. A monolayer of a material covering a surface of an underlying body or base structure (e.g. in direct contact) may be regarded as a conformal layer. A monolayer or a bilayer of a structural two-dimensional material covering a surface of an underlying body or base structure (e.g. in direct contact) may be regarded as a conformal layer.

As described herein, a structural two-dimensional material may exhibit unique physical and/or chemical properties. Graphene for example may be a semiconductor (e.g. a zero-gap semiconductor), or a semi-metal having a very high charge carrier mobility (e.g. in the range from about 40,000 to about 200,000 $cm^2/Vs$ on an electrically insulating substrate). Further, graphene may have other unique properties (electrical, mechanical, magnetic, thermal, optical, and the like), making graphene interesting for electronic industry (e.g. for the use in sensors (gas sensors, magnetic sensors), as electrodes, in transistors, as quantum dots, and the like). However, using graphene, as well as other promising structural two-dimensional materials, may include one or more graphene layers (e.g. a graphene monolayer, e.g. a graphene bilayer, e.g. a graphene multilayer) disposed on an electrically insulating substrate, e.g. in silicon dioxide.

According to various embodiments, a method for processing a carrier may be provided, which may be used for forming a structural two-dimensional layer on an arbitrary substrate. According to various embodiments, the method for processing a carrier may be used for forming a monolayer of a material, e.g. a graphene monolayer or a graphene sheet. According to various embodiments, the method for processing a carrier may be used for forming a bilayer of a material, e.g. a graphene bilayer. According to various embodiments, the method for processing a carrier may be used for forming a layer stack including a plurality of graphene sheets. According to various embodiments, the method for processing a carrier may be used for forming a layer including a structural two-dimensional material, e.g. graphene. According to various embodiments, the method for processing a carrier, as described herein, may enable a simple, controllable, reproducible, stable, cost efficient manufacturing of a layer including a structural two-dimensional material (e.g. of one or more graphene layers or graphene sheets) on an electrically insulating substrate (or on an arbitrary substrate, since the process may not be limited to a specific type of substrates). Further, according to various embodiments, the method for processing a carrier, as described herein, may allow the processing of large areas (e.g. larger than 1 $mm^2$) and/or processing of structured (patterned) substrates. In other words, the method for processing a carrier, as described herein, may allow the manufacturing of a layer including a structural two-dimensional material having a large lateral extension and/or covering a large area of a carrier. Further, the method for processing a carrier, as described herein, may reduce or may prevent the formation of foldings and/or wrinkles in a structural two-dimensional material formed over a carrier. Further, the method for processing a carrier, as described herein, may enable a fast manufacturing process being easily adapted or used for various electrically insulating substrates and/or electrically conductive substrates. Therefore, the method for processing a carrier, as described herein, may circumvent and/or solve actual problems in manufacturing graphene monolayers, graphene bilayers, and/or graphene multilayers. Further, the method for processing a carrier, as described herein, may be adapted to manufacture other structural two-dimensional layers, e.g. silicene layers, germanene layers, and the like.

Common manufacturing methods for graphene on electrically insulating substrates may include segregation of carbon from a metal (e.g. nickel), wherein carbon may be dissolved in a metal layer on a substrate at high temperatures, such that the metal can dissolve carbon, and wherein the carbon segregates while the metal layer is cooled down. Since the carbon may be provided in common processes by using for example carbon ion implantation or decomposing carbon containing materials at high temperatures, the carbon may be substantially introduced at the surface of the metal (away from the interface of the metal to the substrate), which may result in a preferential formation (segregation) of graphene at the surface of the metal layer and not at the interface to the substrate. This may cause for example the problem that it may be difficult to expose the graphene layer using common processes, e.g. removing the metal via etching, since the graphene formation at the surface of the metal layer may be accompanied by the formation of one or more carbide-phases below the graphene. Therefore, etching the metal layer in a common process, e.g. to expose the graphene layer at the interface to the substrate, may be difficult and may include removing the upper graphene layer at the surface of the metal layer using additional complex etch processes (e.g. using plasma etching in oxygen-containing atmosphere or thermal etching in oxygen-containing atmosphere at high temperatures (larger than 500° C.)). Further, removing the occurring one or more carbide-phases on or within the metal layer may be difficult and uniformly removing the occurring one or more carbide-phases may be difficult and/or even impossible, which may cause problems in removing the metal layer and exposing the graphene layer which is formed at the surface of the substrate.

According to various embodiments, the method for processing a carrier, as described herein, may further prevent the formation of carbide-phases and/or graphene segregation on top of the metal layer, resulting in an enhanced deposition process for graphene layers (monolayers, bilayers or multilayers).

Various embodiments illustratively provide a method for manufacturing a pure graphene layer (or graphene sheet) on an electrically insulating substrate, wherein the electrically insulating substrate may also be a patterned substrate having an electrically insulating surface (or surface layer). In other words, a graphene layer (monolayer, bilayer, trilayer, and the like) may be formed on an electrically insulating substrate, such that the graphene layer may not have a contact to a metal or to an electrically conductive material. Therefore, the electronic properties of the graphene layer for example may be not influenced by an adjacent metal or an adjacent electrically conductive material. According to various embodiments, the method for processing a carrier, as described herein, may allow the controlled formation of a graphene layer on a surface of a dielectric substrate via segregation of carbon from a metal layer being arranged over the substrate, avoiding formation of carbide-phases and unwanted carbon segregation on the surface of the metal layer.

Further, according to various embodiments, a method for manufacturing a pure graphene layer (or graphene sheet) on an electrically insulating substrate, may be provided, which may allow the controlled formation of single layer graphene and/or multilayer graphene via controlling at least one of the hydrogen content of the carbon, the hydrogen content of the catalytic metal and the hydrogen content of the annealing atmosphere for forming the graphene layer.

FIG. 1 schematically shows a flow diagram of a method 100 for processing a carrier, according to various embodiments. According to various embodiments, the method 100 for processing a carrier may include: in 110, forming a first catalytic metal layer over a carrier; in 120, forming a source layer over the first catalytic metal layer; in 130, forming a second catalytic metal layer over the source layer, wherein the thickness of the second catalytic metal layer may be larger than the thickness of the first catalytic metal layer; and, in 140, subsequently performing an anneal to enable diffusion of the material of the source layer forming an interface layer adjacent to the surface of the carrier from the diffused material of the source layer.

According to various embodiments, performing an anneal may include annealing the carrier, wherein one or more layers being formed over the carrier may be annealed as well. According to various embodiments, performing an anneal may include annealing the one or more layers being formed over the carrier. According to various embodiments, performing an anneal may include performing an annealing process or may include an annealing process. In other words, the anneal may be an annealing process, as described herein.

According to various embodiments, the interface layer being formed during performing an anneal 140 may be a layer including a structural two-dimensional material. Further, according to various embodiments, the interface layer being formed during performing an anneal 140 may be a monolayer of a material having a two-dimensional crystal structure. Further, according to various embodiments, the interface layer being formed during performing an anneal 140 may be a bilayer of a material having a two-dimensional crystal structure. Further, according to various embodiments, the interface layer being formed during performing an anneal 140 may be a multilayer of a material having a two-dimensional crystal structure. In other words, method 100 may include in 140, subsequently performing an anneal to enable diffusion of the material of the source layer forming an interface layer adjacent to the surface of the carrier from the diffused material of the source layer, the interface layer being at least one of a layer including a structural two-dimensional material, a monolayer of a material having a two-dimensional crystal structure, a bilayer of a material having a two-dimensional crystal structure, and a multilayer of a material having a two-dimensional crystal structure. According to various embodiments, a material having a two-dimensional crystal structure may include at least one material of the following group of material, the group consisting of: graphene, graphane, silicene, silicane, germanene, germanane or other materials crystallizing in a hexagonal planar lattice structure, e.g. hexagonal boron nitride sheets, layered metal chalcogenides, and layered transition metal dichalcogenides.

According to various embodiments, the source layer may include a source material for forming the interface layer. According to various embodiments, the catalytic metal layers may include a catalytic material or metal for dissolving and segregating the source material of the source layer.

According to various embodiments, forming a layer, e.g. a metal layer, e.g. a metal layer including a catalytic metal, e.g. a semiconductor layer, e.g. a layer including carbon, silicon, germanium, and the like, may include a layering process as used in semiconductor industry, e.g. a CVD process or a PVD process.

According to various embodiments, a chemical vapor deposition process (CVD process) may include a variety of modifications, as for example atmospheric pressure CVD (APCVD), low pressure CVD (LPCVD), ultrahigh vacuum CVD (UHVCVD), plasma enhanced CVD (PECVD), high density plasma CVD (HDPCVD), remote plasma enhanced CVD (RPECVD), atomic layer deposition (ALD), atomic layer CVD (ALCVD), vapor phase epitaxy (VPE), metal organic CVD (MOCVD), hybrid physical CVD (HPCVD), and the like. According to various embodiments, carbon, silicon, germanium, nickel, cobalt, iron, ruthenium, rhodium, platinum, iridium, copper, gold, silver, tantalum, titanium nitride, silicon nitride, and the like, may be deposited using LPCVD, ALD, or atomic layer CVD (or using a PVD process). According to various embodiments, physical vapor deposition may include a variety of modifications, as for example magnetron sputtering (AC-sputtering, DC-sputtering), ion-beam sputtering (IBS), reactive sputtering, high-power impulse magnetron sputtering (HIPIMS), vacuum evaporation, molecular beam epitaxy (MBE), and the like.

According to various embodiments, a layer or a carrier (a substrate) may be patterned using for example a lithographic process (including applying a resist, exposing a resist, and developing a resist), and an etch process (e.g. a wet etch process using etch chemistry or a dry-etch process using for example plasma etching, reactive plasma etching, ion beam milling, and the like). Further, patterning a layer or a carrier (a substrate) may include applying a mask layer (e.g. a hard mask layer or a soft mask layer), patterning the mask layer exposing the underlying layer or carrier, and selectively etching the underlying layer or carrier. Further, a patterning process may further include resist stripping, e.g. after the etch process has been carried out.

According to various embodiments, performing an anneal (e.g. annealing a layer stack on a carrier) may include a heat treatment of a carrier or of a layer stack on a carrier. According to various embodiments, the heating of a carrier (a wafer, a substrate, and the like) or a layer stack on a carrier may be performed using direct contact heating, e.g. via a hot plate, or by radiation heating, e.g. via a laser or via one or more lamps. According to various embodiments, an annealing process (e.g. performing an anneal) may be performed under vacuum conditions using for example a laser heater or a lamp heater. Parameters of an annealing process may be the heating rate, the annealing temperature, the annealing duration, the cooling rate, and in case the annealing process may be performed in a gas atmosphere, the chemical composition of the annealing gas and the gas pressure of the annealing gas.

According to various embodiments, a catalytic metal, as described herein, may participate at the formation of the interface layer, e.g. nickel as catalytic metal layer may allow forming a graphene layer at the interface between the carrier and the catalytic metal layer, wherein the catalytic metal may not primarily chemically react with the carbon. According to various embodiments, for processing a source material (e.g. silicon, carbon, germanium), a corresponding catalytic metal may be any material, which may dissolve the source material at high temperatures, wherein there may be no stable phase at room temperatures including the source material and the catalytic metal, such that the source material may segregate from the catalytic metal again. According to various embodiments, the catalytic metal used in method 100 may be adapted to the source material to be processed.

Figure 2A:
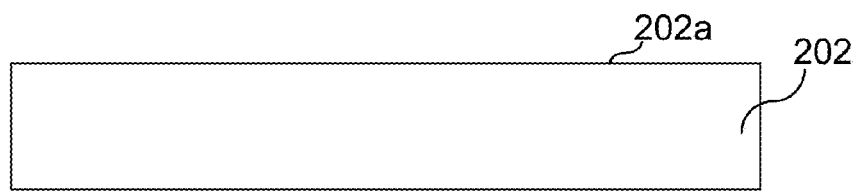
FIGS. 2A to 2F show respectively a carrier at various processing stages during the method for processing a carrier, in accordance with various embodiments.

FIG. 2A shows a carrier 202 having an upper surface 202a at an initial processing stage of the method 100 for processing a carrier. According to various embodiments, the carrier may be a wafer, a substrate, or any other type of carrier, which may be suitable for performing the respective layering processes (110, 120, 130) and the annealing process (140) of method 100, e.g. the carrier may be a coated metal tape or an already processed wafer. According to various embodiments, the carrier may have a main processing surface 202a defining a lateral direction 203, as for example shown in FIGS. 2A to 2F. According to various embodiments, the carrier may have a thickness direction 201 being perpendicular to the lateral direction 203, e.g. being perpendicular to the main processing surface 202a of the carrier 202.

The carrier 202 may be a substrate (e.g. a wafer substrate), which may be made of semiconductor materials of various types, including silicon, germanium, Group III to V or other types, including polymers, for example, although in another embodiment, other suitable materials can also be used. In various embodiments, the substrate may be made of silicon (doped or undoped), in an alternative embodiment, the substrate may be a silicon on insulator (SOI) wafer. As an alternative, any other suitable semiconductor materials can be used for the substrate, for example semiconductor compound material such as silicon carbide (SiC), gallium nitride (GaN), gallium arsenide (GaAs), indium phosphide (InP), but also any suitable ternary semiconductor compound material or quaternary semiconductor compound material such as indium gallium arsenide (InGaAs). Furthermore, in various embodiments, the substrate 202 may be made of or include dielectric material (electrically insulating material), such as silicon oxide ($SiO_2$), silicon nitride ($Si_3N_4$), silicon carbide (SiC), aluminum oxide ($Al_2O_3$), hafnium oxide ($HfO_2$), or zirconium oxide ($ZrO_2$).

Figure 2B:
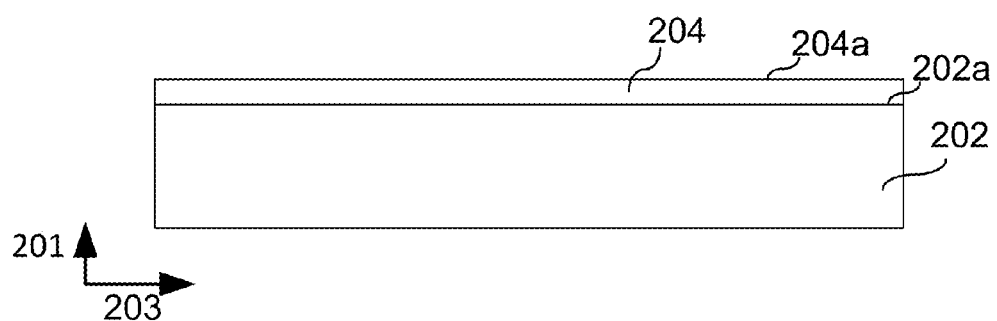

FIG. 2B exemplarily shows a schematic cross sectional view or side view of the carrier 202 after process 110 of method 100 has been carried out, e.g. after a first catalytic metal layer 204 has been formed over the carrier 202.

According to various embodiments, the surface 202a of the carrier 202 (e.g. the main processing surface 202a of the carrier 202) may be at least partially covered with a first catalytic metal layer 204. Further, the first catalytic metal layer 204 may be in direct contact with the carrier, as shown in FIG. 2B. According to various embodiments, the first catalytic metal layer 204 may be deposited over the whole surface 202a of the carrier 202, e.g. covering a surface area of the carrier 202 being larger than several square millimeter, e.g. covering a surface area of the carrier 202 being larger than several square centimeter, e.g. covering a surface area of the carrier 202 in the range from about 1 $mm^2$ to about 2000 $cm^2$, e.g. covering a surface area of the carrier 202 in the range from about 1 $mm^2$ to about 1000 $cm^2$. According to various embodiments, applying method 100, as described herein, may not be limited to a specific size of the carrier, as long as the layering processes and the annealing process may be realized.

According to various embodiments, the first catalytic metal layer 204 may have a thickness (e.g. a lateral extension along the direction 201) in the range from about 5 nm to about 100 nm, e.g. in the range from about 5 nm to about 50 nm. Further, the first catalytic metal layer 204 may include at least one material of the following group of materials: a transition metal, e.g. nickel, cobalt, iron, ruthenium, rhodium, platinum, iridium, or any other material which may allow dissolving and segregating the source material of the source layer 206 being formed over the catalytic metal layer 204 during process 120 of method 100, as described herein.

The carrier 202 may be an electrically insulating carrier or may at least include an electrically insulating surface layer or surface region. The carrier 202 may be an electrically conductive carrier, if it may be desired for a specific application. In other words, the method 100 as described herein may not be limited to a specific kind of substrate.

Figure 2C:
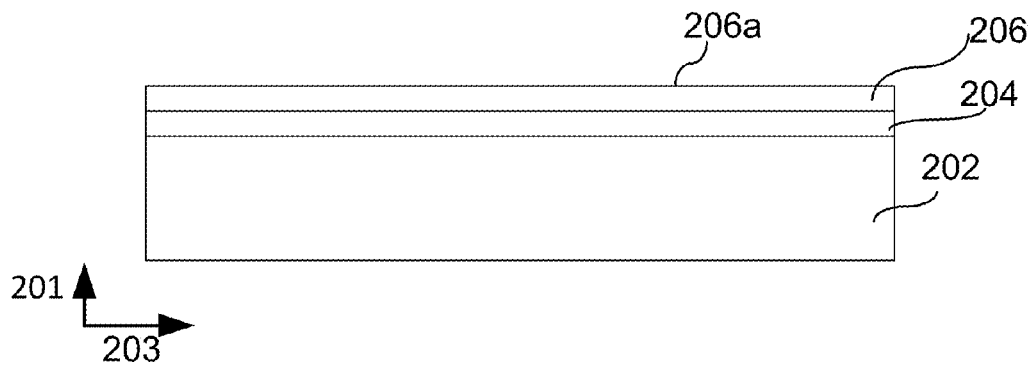

FIG. 2C exemplarily shows a schematic cross sectional view or side view of the carrier 202 after process 110 and process 120 of method 100 have been carried out, e.g. after a first catalytic metal layer 204 has been formed over the carrier 202 and after a source layer 206 has been formed over the first catalytic metal layer 204.

According to various embodiments, the surface 204a of the first catalytic metal layer 204 may be at least partially covered with the source layer 206. Further, the source layer 206 may be in direct contact with the first catalytic metal layer 204, as shown in FIG. 2C. According to various embodiments, the source layer 206 may be formed (or deposited) over the whole surface 204a of the first catalytic metal layer 204. Therefore, the lateral extension (e.g. the extension along a lateral direction 203 or e.g. along a direction parallel to the surface 202a of the carrier 202) of the first catalytic metal layer 204 may be the same as the lateral extension of the source layer 206.

According to various embodiments, the source layer 206 may have a thickness in the range from about 0.2 nm to about 10 nm, e.g. in the range from about 0.34 nm to about 10 nm. Further, the source layer 206 may include at least one material of the following group of materials: silicon, carbon, germanium, boron, gallium, selenium, or any other material which may allow dissolving and segregating in combination with a catalytic metal included in the catalytic metal layer 204, as described herein.

Forming a source layer 206 over the first catalytic metal layer 204 may include forming a carbon layer 206 or forming a layer 206 including at least one of carbon and hydrogen over the first catalytic metal layer 204. Further, according to various embodiments, forming a source layer 206 over the first catalytic metal layer 204 may include forming a silicon layer 206 or forming a layer 206 including at least one of silicon and hydrogen over the first catalytic metal layer 204. Further, according to various embodiments, forming a source layer 206 over the first catalytic metal layer 204 may include forming a germanium layer 206 or forming a layer 206 including at least one of germanium and hydrogen over the first catalytic metal layer 204. The source layer 206 formed over the first catalytic metal layer 204 may include a material to be processed, e.g. a material to be dissolved in the catalytic metal of the catalytic metal layers 204, 208, as described herein. Further, the source layer 206 being formed over the first catalytic metal layer 204 may include the material to form the interface layer, e.g. to form a structural two-dimensional material, after the annealing process 140 has been carried out and/or during the annealing process 140, as described herein.

Figure 2D:
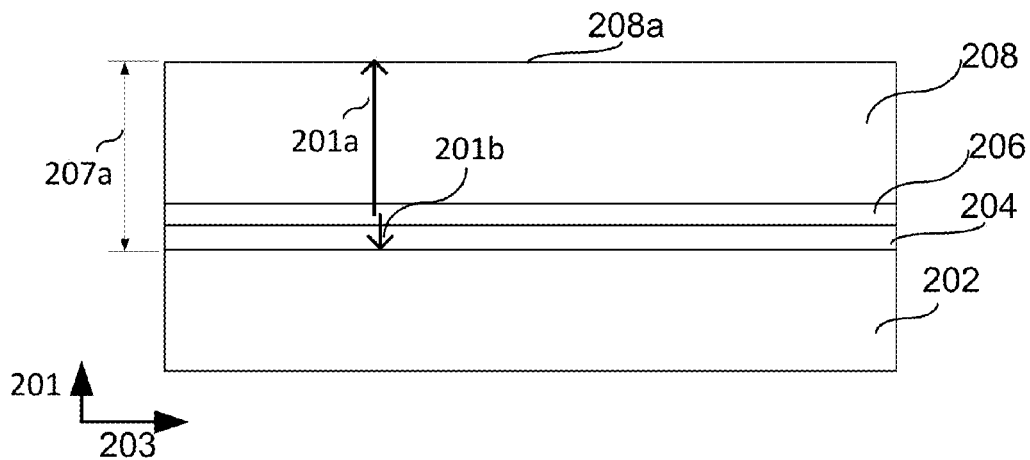

FIG. 2D exemplarily shows a schematic cross sectional view or side view of the carrier 202 after process 110, process 120, and process 130 of method 100 have been carried out, e.g. after a first catalytic metal layer 204 has been formed over the carrier 202, after a source layer 206 has been formed over the first catalytic metal layer 204, and after a second catalytic metal layer 208 has been formed over the source layer 206.

According to various embodiments, the surface 206a of the source layer 206 may be at least partially covered with the second catalytic metal layer 208. Further, the second catalytic metal layer 208 may be in direct contact with the source layer 206, as shown in FIG. 2D. According to various embodiments, the second catalytic metal layer 208 may be deposited over the whole surface 206a of the source layer 206. Therefore, the lateral extension (e.g. the extension along the lateral direction 203 or e.g. along a direction parallel to the surface 202a of the carrier 202) of the second catalytic metal layer 208 may be the same as the lateral extension of the source layer 206.

The second catalytic metal layer 208 may have a thickness in the range from about 2 nm to about 5 μm, e.g. in the range from about 10 nm to about 1 μm. Further, the second catalytic metal layer 208 may include at least one material of the following group of materials: a transition metal, e.g. nickel, cobalt, iron, ruthenium, rhodium, platinum, iridium, or any other material which may allow dissolving and segregating the material of the source layer 206 being formed between the catalytic metal layers 204, 208, as described herein. The thickness of the second catalytic metal layer 208 may be larger than the thickness of the first catalytic metal layer 204, e.g. the ratio between the layer thicknesses of the second catalytic metal layer 208 and the first catalytic metal layer 204 may be larger than about 1, e.g. larger than about 1.5, e.g. larger than about 2, e.g. larger than about 4, e.g. in the range from about 1.5 to about 20. Therefore, according to various embodiments, the segregation of the material of the source layer 206 may take place at the surface 202a of the carrier, since the diffusion distance 201a of the source material of the source layer 206 to the surface 208a of the second catalytic metal layer 208 may be larger than the diffusion distance 201b of the source material of the source layer 206 to the surface 202a of the carrier 202, and the segregation may in general either take place the surface 208a or at the surface 202a of the carrier 202.

As illustrated in FIG. 2D, method 100 may include forming a layer stack 207a including the material to be processed (the source material), the source material being arranged for example in layer 206 between the two layers 204, 208 including the catalytic metal. The first catalytic metal layer 204 and the second catalytic metal layer 208 may include the same catalytic material or catalytic metal. A catalytic metal may further include any catalytic material being suitable for dissolving and segregating the material to be processed of layer 206, e.g. including at least one of the following materials: a catalytic compound, a nickel compound, a cobalt compound, an iridium compound a catalytic intermetallic compound, a catalytic alloy, a nickel alloy, a cobalt alloy, an iridium alloy, and the like. The catalytic metal may allow the diffusion of the source material of the source layer 206 through the catalytic metal layer, e.g. through the first catalytic metal layer 204.

Figure 2E:
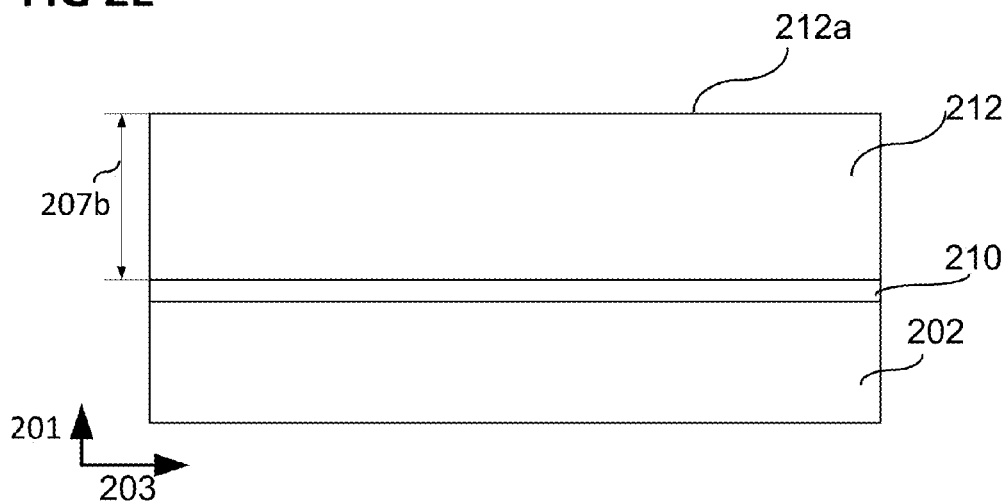

FIG. 2E exemplarily shows a schematic cross sectional view or side view of the carrier 202 after process 110, process 120, process 130, and process 140 of method 100 have been carried out, e.g. after a first catalytic metal layer 204 has been formed over the carrier 202, after a source layer 206 has been formed over the first catalytic metal layer 204 and after a second catalytic metal layer 208 has been formed over the source layer 206, and after an annealing process has been carried out. According to various embodiments, performing an anneal (e.g. an annealing process) may include at least a heating process, wherein the carrier may be heated up to a desired annealing temperature, a heat treatment, wherein the carrier may be subjected to the heat for a desired annealing duration, and a cooling process, wherein the carrier may be cooled down to room temperature.

The annealing may be carried out to enable the diffusion of the material of the source layer 206 forming the interface layer 210 adjacent to the surface 202a of the carrier 202, wherein the interface layer 210 may include the diffused material of the source layer 206. As shown in FIG. 2E, after the annealing process has been carried out, an interface layer 210 may be formed over the surface 202a of the carrier 202, wherein the interface layer 210 may be covered with a catalytic material layer 212 (a remaining catalytic metal layer 212) including at least the remaining catalytic material of the first catalytic metal layer 204 and the second catalytic metal layer 208.

The annealed layer stack 207a may be transformed during the annealing into the interface layer 210 and the catalytic material layer 212.

During the heating process and/or the heat treatment of the annealing process, the source material of the source layer 206 may be dissolved within the catalytic metal layers 204, 208. During the heating process and/or the heat treatment of the annealing process, the source material of the source layer 206 may diffuse inhomogeneously into the catalytic metal layers 204, 208. The concentration of source material during the heating and/or the heat treatment of the annealing process may be larger in a first region near the carrier than in a second region near the surface of the catalytic metal layer. The amount of source material which may be dissolved within the catalytic metal layers 204, 208 may be defined by the respective layer thickness of the source layer 206. The concentration of source material which may be dissolved within the catalytic metal layers 204, 208 and the distribution of the source material within the catalytic metal layers 204, 208 may be defined and/or influenced by the thickness of the source layer 206 and the respective thickness of the first catalytic metal layer 204 and the second catalytic metal layer 208.

Further, during the cooling process of the annealing the source material which is dissolved within the catalytic metal layers 204, 208 may segregate (chemically segregate or separate) from the catalytic metal layers 204, 208 forming an interface layer 210 adjacent to the surface 202a of the carrier 202. Since the distance 201b from the source layer 206 of the layer stack 207a to the surface 202a of the carrier 202 may be smaller than the distance 201a from the source layer 206 of the layer stack 207a to the surface 208a of the catalytic metal layer 208, the material of the source layer 206 dissolved within the catalytic metal layers 204, 208 may not segregate at the surface 212a of the catalytic material layer 212 during the annealing and/or after the annealing has been carried out. Therefore, the remaining catalytic material layer 212 may be removed in a subsequently performed etch process. Further, since the source material (e.g. carbon) of the source layer 206 may be arranged near the surface 202a of the carrier 202, the formation of a secondary phase (e.g. nickel carbide) including source material (e.g. carbon) from the source layer 206 and a material (e.g. nickel) from the catalytic metal layers 204, 208 may be prevented.

Further, this effect may be enhanced by using a diffusion barrier layer being arranged above the source layer 206 or being arranged between the source layer 206 and the second catalytic metal layer 208. Since the phase formation of one or more carbide phases may be a significantly reduced or may be prevented, the remaining catalytic material layer 212 may be removed easily using an etching process. Alternatively, the second catalytic metal layer 208 may be configured as diffusion barrier layer.

While method 100 is carried out, hydrogen may be introduced into the source layer 206, which may change the properties of the interface layer 210 after the annealing process. While method 100 is carried out, hydrogen may be introduced at least into one catalytic metal layer 204, 208, which may change the properties of the interface layer 210 after the annealing process.

Figure 2F:
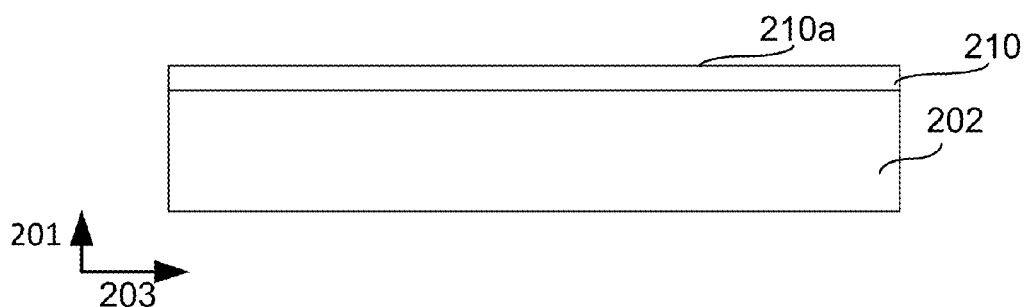

FIG. 2F shows a schematic cross sectional view or side view of the carrier 202 after process 110, process 120, process 130, and process 140 of method 100 have been carried out, as described referring to FIG. 2E, and the remaining catalytic material layer 212 may be removed in an additional process.

Referring to FIG. 2F, the method 100 for processing a carrier 202 may further include removing the remaining catalytic material layer 212 after the annealing has been carried out, such that the interface layer 210 may be exposed or may be at least partially exposed. The interface layer 210 may exclusively consist of the source material, which was deposited over the first catalytic metal layer 204 in process 120 of method 100.

Method 100 may be used, as described herein, to form a graphene sheet, e.g. a monolayer of graphene, e.g. a bilayer of graphene, e.g. a multilayer of graphene. Therefore, a first catalytic metal layer 204 may be formed over the carrier 202 including or consisting of at least one of the following metals: nickel, cobalt, iron, ruthenium, rhodium, platinum, iridium. The first catalytic metal layer 204 may have a thickness of about 20 nm and may be deposited using a CVD process or a PVD process. Subsequently, a carbon layer 206 may be formed over the first catalytic metal layer 204, e.g. over the nickel layer 204. The carbon layer 206 may have a thickness of about 1 nm and may be deposited using a CVD process or a PVD process. The carbon layer 206 may further include a controlled amount of hydrogen, which may be introduced into the carbon layer 206 during the deposition of carbon layer 206 or in a hydrogenation process afterwards. The carbon layer 206 may be the carbon source for forming the graphene sheet 210 during the annealing process. Subsequently, a second catalytic metal layer 208 may be formed over the carbon layer 206, the second catalytic metal layer 208 including or consisting of at least one of the following metals: nickel, cobalt, iron, ruthenium, rhodium, platinum, iridium. The first and the second catalytic metal layer 204, 208 may include or may consist of the same material, e.g. nickel. The second catalytic metal layer 208 may have a thickness of about 100 nm and may be deposited using a CVD process or a PVD process.

The layer stack 207a, e.g. including a carbon layer 206 disposed between the two catalytic nickel layers 204, 208, may be annealed in an annealing process. The carrier 202 including the layer stack 207a may be heated up to an annealing temperature in the range from about 600° C. to about 1100° C., with a heating rate in the range from about 0.1° K/s to about 50° K/s. The annealing duration may be in range from about 1 min to about 60 min (or even longer than 60 min). Further, according to various embodiments, the cooling rate may be in the range from about 0.1° K/s to about 50° K/s.

During the annealing process (e.g. process 140), the carbon layer 206 may be disintegrated, since the carbon of the source layer 206 may diffuse into (or may be dissolved in) the catalytic metal layers 204, 208. The catalytic metal may be selected such that the catalytic metal may not form a stable phase including the carbon, e.g. at least in a certain composition and temperature range. Therefore, carbon being dissolved in a catalytic material layer may segregate from the catalytic material layer during the cooling of the carrier 202. Since the carbon may be introduced into the catalytic material layer near the carrier 202, the carbon may segregate exclusively at the interface between the carrier 202 and the catalytic material layer 212, e.g. at the surface 202*a* of the carrier 202. The carbon being segregated from the catalytic material layer 212 during cooling may form a graphene monolayer 210, e.g. a graphene sheet 210. Further, the carbon being segregated from the catalytic material layer 212 during cooling may form a graphene bilayer, e.g. a graphene layer 210 including two graphene monolayers stacked above each other. Further, the carbon being segregated from the catalytic material layer 212 during cooling may form a graphene multilayer, e.g. a graphene layer 210 including a multiplicity of graphene monolayers stacked above each other. Further, method 100 may allow the controlled growth of a carbon monolayer, a carbon bilayer, or a carbon multilayer, depending on the amount of hydrogen being introduced into the carbon layer before the annealing process 140 or being introduced into the catalytic material layer 212 during the annealing process 140 or being introduced into the graphene layer 210 during the annealing process 140. According to various embodiments, introducing hydrogen into the carbon layer 206 may cause the formation of a graphene monolayer 210 during the annealing process, wherein in absence of hydrogen a graphene bilayer 210 or a graphene multilayer 210 may be formed.

The annealing process 140 may be performed under vacuum conditions, e.g. in high vacuum. Further, during the annealing process 140, an annealing gas may be utilized, e.g. at least one of argon (or another inert gas), nitrogen, hydrogen, ammonia, and the like. Using a process gas (or an annealing gas) may allow introducing hydrogen into the carbon layer 206 or into the graphene sheet (graphene layer) 210 formed during the annealing process.

According to various embodiments, a pre-saturation of the catalytic metal with hydrogen may cause the formation of a graphene monolayer 210 during the annealing process, wherein a graphene multilayer 210 may be formed without hydrogen a pre-saturation of the catalytic metal.

The carbon layer 206 may be deposited using a hydrogen free carbon PVD process. The carbon layer 206 may be deposited using a carbon PVD, a plasma-enhanced CVD (PECVD) or a thermal CVD (LPCVD, APCVD) process which may allow introducing a controlled amount of hydrogen into the carbon layer 206.

Since the carbon of the carbon layer 206 may form (during the annealing) the graphene sheet 210 at the interface between the catalytic material layer 212 and the carrier, e.g. below the catalytic material layer 212, e.g. directly on the carrier 202, the remaining catalytic material layer 212 may be easily removed in a subsequently performed etch process.

Figure 3A:
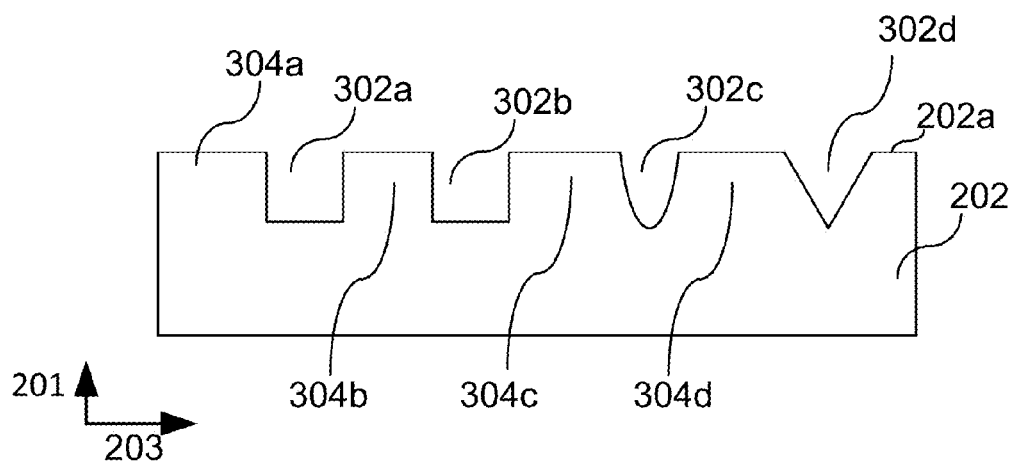
FIGS. 3A and 3B show respectively a patterned carrier at various processing stages during the method for processing a carrier, in accordance with various embodiments.
Figure 3B:
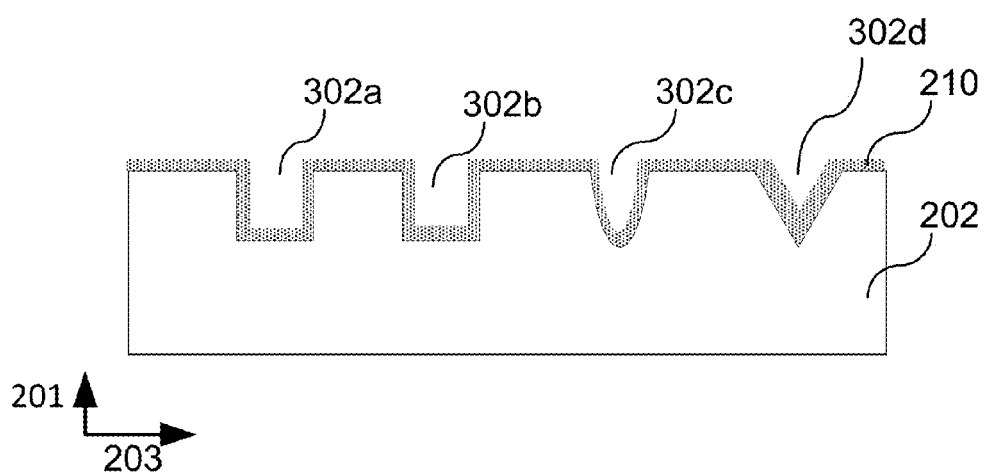

Further, using one or more conformal deposition processes, such as LPCVD or ALD, the layer stack 207*a* may also be formed over one or more three-dimensional structures, e.g. over one or more structure elements being arranged on the carrier, e.g. over one or more recesses being arranged in the carrier, as shown for example in FIGS. 3A and 3B. Therefore, method 100 may allow forming one of a graphene monolayer, a graphene bilayer, and a graphene multilayer over one or more three-dimensional structures.

Figure 4A:
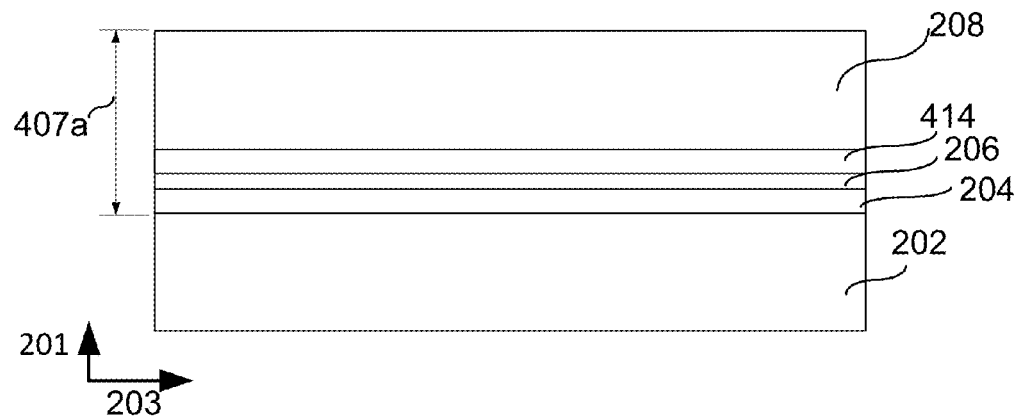
FIGS. 4A to 4C show respectively a carrier at various processing stages during the method for processing a carrier, in accordance with various embodiments.
Figure 4B:
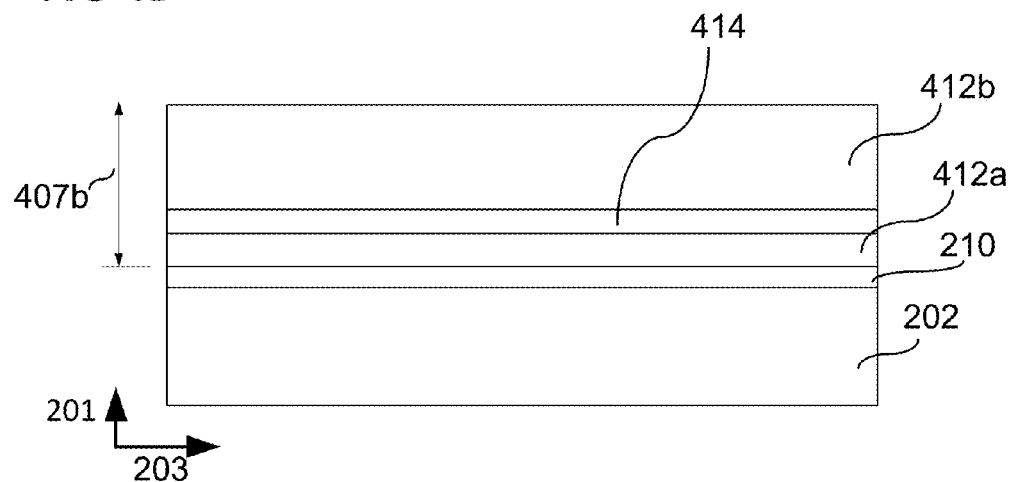
Figure 4C:
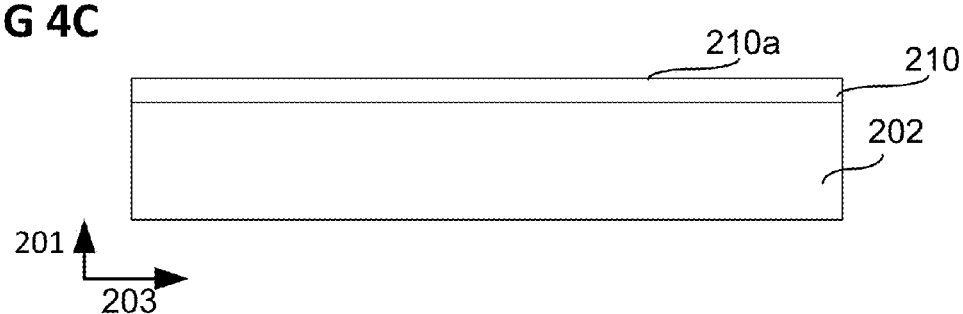

Furthermore, a diffusion barrier layer being deposited over the carbon layer 206 may assist the formation of graphene 210 at the interface between the carrier 202 and the catalytic material layer 212, as shown for example in FIGS. 4A to 4C. The diffusion barrier layer may prevent the carbon diffusing from the carbon layer 206 to the surface of the annealed layer stack 207*b* (or the surface of the catalytic material layer).

Method 100, as described herein, may allow the formation of a graphene sheet 210 directly on a carrier 202, as shown for example in FIG. 2F. Method 100, as described herein, may allow the formation of a graphene sheet 210 via an asymmetric segregation from a catalytic metal layer of carbon being previously dissolved in the catalytic metal layer. Method 100, as described herein, may prevent or at least reduce the formation of graphene and one or more metal-carbide-phases within the catalytic material layer 212 over the graphene layer 210. Therefore, according to various embodiments, the catalytic material layer 212 may be removed easily using an etch process to expose the graphene sheet 210 being arranged directly on a dielectric surface 202*a*, wherein the graphene sheet 210 may have no contact to an electrically conductive material such that the physical (electronic) properties of the graphene sheet 210 may not be influence by an adjacent electrically conductive layer injecting for example unwanted charge carriers into the graphene sheet 210.

Further, controlling the hydrogen content during the annealing process or during the formation of the carbon layer 206 may allow the control of the carbon segregation forming a graphene monolayer, a graphene bilayer, or a graphene multilayer.

According to various embodiments, the method 100 for processing a carrier may further include patterning the carrier 202 before the first catalytic metal layer 204 is formed or before the layer stack 207*a* is formed. Further, according to various embodiments, the method 100 for processing a carrier 202 may allow forming a conformal interface layer 210 over the carrier 202 including a structural two-dimensional material. Further, according to various embodiments, the method 100 for processing a carrier 202 may allow forming a conformal graphene sheet or graphene layer 210 over the patterned carrier 202.

FIG. 3A illustrates a patterned carrier 202 in a cross sectional view or side view, according to various embodiments. According to various embodiments, the patterned carrier 202 may include one recess or a plurality of recesses 302*a*, 302*b*, 302*c*, 302*d*. According to various embodiments, the one recess or the plurality of recesses 302*a*, 302*b*, 302*c*, 302*d* may be formed into the carrier using for example a patterning process, as usually performed in semiconductor industry. Further, the one recess or the plurality of recesses being formed in the carrier 202 may have any desired shape, e.g. an angled shape or a rounded shape. According to various embodiments, at least one recess formed in the carrier 202 may have one of the following shapes: a cuboidal shape, a prismatic shape, a cylindrical shape, a spherical shape, a hemispherical shape, an ellipsoidal shape, and the like. According to various embodiments, the carrier 202 may include one structure element or a plurality of structure elements 304*a*, 304*b*, 304*c*, 304*d*. According to various embodiments, the one structure element or the plurality of structure elements 304*a*, 304*b*, 304*c*, 304*d* may be formed at least one of over and in the carrier using for example at least one of a layering process and a patterning process, as usually performed in semiconductor industry. Further, the one structure element or the plurality of structure elements 304*a*, 304*b*, 304*c*, 304*d* being formed at least one of over and in the carrier 202 may have any desired shape, e.g. an angled shape or a rounded shape. According to various embodiments, at least one structure element being formed at least one of over and in the carrier 202 may have one of the following shapes: a cuboidal shape, a prismatic shape, a cylindrical shape, a spherical shape, a hemispherical shape, an ellipsoidal shape, and the like.

FIG. 3B illustrates a patterned carrier 202, in a cross sectional view or side view, including conformal layer 210 of a structural two-dimensional material after method 100 has been carried out, as described before referring to FIGS. 2A to 2F, according to various embodiments. According to various embodiments, a conformal layer 210 may be formed over the patterned carrier 202 including a structural two-dimensional material, e.g. graphene, graphane, silicene, silicane, germanene, germanane. According to various embodiments, the conformal layer 210 may be a graphene monolayer or a graphene bilayer. Further, according to various embodiments, method 100 may be used to form an electronic component or an electronic device, e.g. a transistor or a sensor, or an integrated circuit component.

An electronic component or a part of an electronic component (for example shown in FIG. 3B) may include an electrically insulating patterned base layer 202 providing a three-dimensional surface structure; and a conformal layer 210 disposed over the patterned base layer 202, the conformal layer 210 being a monolayer, a bilayer, or a multilayer of a material having a two-dimensional lattice structure, wherein the conformal layer 210 may enable a spatially confined charge carrier transport along the surface 202a of the patterned base layer 202.

The patterned base layer 202 may be a patterned carrier 202, as described herein. The patterned base layer 202 may include or may consist of an electrically insulating material, e.g. silicon dioxide. The patterned base layer 202 or the patterned carrier 202 may include one or more recesses and/or one or more structure elements, as already described.

The conformal layer 210 may enable a spatially confined charge carrier transport. According to various embodiments, the conformal layer 210 may include at least one of a graphene monolayer and a graphene bilayer which may allow a sufficient high charge carrier transport in a layer having a thickness smaller than about 1 nm. In other words, the charge carrier transport may be confined to a region which may have an extension smaller than 1 nm along at least one spatial direction. The charge carrier transport may be confined to a region which may have an extension along at least one direction being smaller than 0.4 nm. Therefore, the current path may be exactly defined within the conformal layer 210 which may for example enhance the accuracy of a sensor based on a directed current flow, e.g. a hall sensor or a magnetic sensor.

The conformal layer 210 and the patterned base layer 202 may be configured to introduce an internal stress in the layer 210, e.g. due to being conformal with the patterned base layer, which may change the physical properties (electronic properties) of the material of layer 210, e.g. a band gap may be introduced into a graphene monolayer being formed conformally over a patterned base layer 202, or the charge carrier transport behavior of the conformal layer 210 may be changed as desired due to introducing internal mechanical stress and/or strain.

A material having a two-dimensional lattice structure may include at least one material of the following group of materials: graphene, hydrogenated graphene (graphane), silicene, hydrogenated silicene (silicane), germanene, hydrogenated germanene (germanane).

An electronic component including a bilayer of a two-dimensional lattice structure (e.g. a graphene bilayer), may be a part of a transistor, e.g. a channel of a transistor may include a graphene bilayer, wherein a band gap may be introduced into the graphene bilayer by applying an electrical field perpendicular to the planes of the graphene sheets.

Various embodiments illustratively provide dielectric structures, e.g. structure elements 304a, 304b, 304c, 304d or recesses 302a, 302b, 302c, 302d being in contact with a layer of a structural two-dimensional material, e.g. based on graphene. According to various embodiments, the conformal layer 210 of a structural two-dimensional material may be part of an electronic component, wherein electric characteristic (such as e.g. the threshold voltage of the transistor or the flux voltage of a diode) of the electronic component (e.g. the electric characteristic of the structural two-dimensional material, e.g. of the graphene, e.g. its electric resistance as an example of an electric characteristic) may be modified in the desired manner due to an electric field generated by the dielectric structures or due to the shape of the dielectric structures.

A graphene sheet may have a high ampacity (current-carrying capability) of up to $10^8$ A/cm$^2$ so that a very high heating output may be generated without destruction of the graphene sheet. Graphene may be used as an electrode or as a charge carrying structure, wherein method 100, as described herein, may be utilized to form a conformal graphene layer over a patterned base structure.

Furthermore, a structural two-dimensional material containing layer 210 may be arranged over (e.g. in physical contact with) the patterned dielectric structure 202. According to various embodiments, the structural two-dimensional material containing layer 210 may include or be made of graphene. According to various embodiments, the graphene may be provided as a graphene layer structure, wherein the graphene layer structure may include a graphene monolayer or a graphene double-layer, for example. In various embodiments, the structural two-dimensional material 210 may form at least a portion of a channel of a field effect transistor (FET). According to various embodiments, the FET may further include source/drain regions (including source/drain electrodes). According to various embodiments, the structural two-dimensional material 210 may be arranged between and may be electrically coupled to the source/drain regions. Furthermore, according to various embodiments, a gate insulation layer may be deposited over the structural two-dimensional material 210. Moreover, according to various embodiments, a gate region (e.g. including a gate electrode) may be deposited over the gate insulation layer to control the current flow from a source region via the structural two-dimensional material 210 to a drain region of a FET.

The electronic component may be configured as a diode or as a transistor. The structural two-dimensional material being formed over the patterned base layer 202 or over a patterned carrier 202 may form a channel region of a transistor. The structural two-dimensional material may include a plurality of layers so that a band gap may be generated in the material. The structural two-dimensional material may be under internal stress or strain so that a band gap may be provided.

To form an electronic component, method 100 may further include additional layering processes and additional patterning processes. Further, according to various embodiments, the layer stack 207a may be patterned before the annealing process 140 is carried out, to provide a desired structure including the structural two-dimensional material after the annealing process has been carried out.

According to various embodiments, the method 100 for processing a carrier 202 may further include forming a diffusion barrier layer between the source layer 206 and the second catalytic metal layer 208.

FIG. 4A illustrates a carrier 202 after the processes 110, 120, 130 of method 100 has been carried out, according to various embodiments, in analogy to carrier 202 shown in FIG. 2D, wherein the carrier 202 shown in FIG. 4A may include an additional diffusion barrier layer 414 arranged between the source layer 206 and the second catalytic metal layer 208. According to various embodiments, the diffusion barrier layer 414 may be arranged between the carbon layer 206 and the second catalytic metal layer 208 (e.g. a nickel layer 208). According to various embodiments, a layer stack 407a may be formed over a carrier 202, using PVD and/or CVD, as already described.

FIG. 4B illustrates the carrier 202 shown in FIG. 4A after an annealing process has been carried out, e.g. after process 140 of method 100 has been carried out, as already described. The annealed carrier 202 may include an annealed layer stack 407b including catalytic material layers 412a, 412b and the diffusion barrier layer 414. During the annealing process, an interface layer 210 may be formed, according to various embodiments, the interface layer 210 being arranged between the carrier 202 and the annealed layer stack 407b. According to various embodiments, the annealed layer stack 407b may be removed after the interface layer 210 has been formed. The diffusion barrier layer 414 may prevent material from the source layer 206 (e.g. carbon from the carbon layer 206) to diffuse through the second catalytic metal layer 208, and therefore, the source material from the source layer 206 (e.g. carbon from the carbon layer 206) may segregate at the interface to the carrier 202. This may allow to perform a simple etch process for removing the annealed layer stack 407b to expose the surface 210a of the interface layer 210, as already describe and shown for example in FIG. 4C. The interface layer 210 may include or may be a graphene monolayer or a graphene bilayer.

FIG. 5A shows a carrier 202 at various processing stages of method 100 for processing a carrier according to various embodiments. After the processes 110, 120, 130 of method 100 have been carried out, the patterned carrier 202 is covered with a layer stack 207, as already described. In contrast to common methods, the material source 206 (e.g. the carbon source 206) for forming the interface layer 210 (a structural two-dimensional layer, e.g. a graphene layer) may be located near the surface of the carrier 202, which may cause the material of the material source 206 (e.g. the carbon) to diffuse preferentially in the direction of the carrier and to segregate preferentially or exclusively at the surface 202a of the carrier, during the annealing process and/or after the annealing process 140 has been carried out, according to various embodiments. According to various embodiments, the annealed carrier 202 may include an interface layer 210 (e.g. a structural two-dimensional layer, e.g. a graphene layer) and the remaining material 207b of the annealed layer stack 207, wherein the remaining material 207b may include the catalytic material of the catalytic metal layers 204, 208. According to various embodiments, in contrast to common processes (e.g. for manufacturing a graphene layer), the remaining material 207b may be free of (or substantially free of) carbide phases. According to various embodiments, in contrast to common processes (e.g. for manufacturing a graphene layer), the remaining material 207b may be free of (or substantially free of) material from the source layer 206.

The source layer 206 may include carbon as a material source for forming graphene during and/or after the annealing process 140, wherein the remaining material 207b may be free of (or substantially free of) graphene after method 100 has been carried out. In other words, method 100 may allow forming a graphene interface layer 210 covered by a catalytic material layer 212 including the catalytic metal of the catalytic metal layers 204, 208. Therefore, the remaining material 207b (e.g. including nickel) may be removed easily in one single etch process 150, wherein the interface layer 210 (e.g. the graphene layer) may be exposed.

FIG. 5B shows a carrier 202 at various processing stages of method 100 for processing a carrier according to various embodiments. After processes 110, 120, 130 of method 100 have been carried out, wherein a diffusion barrier layer 414 may be formed between the source layer 206 and the second catalytic metal layer 208, the patterned carrier 202 is covered with a layer stack 407a, as already described.

The annealed carrier 202 may include an interface layer 210 (e.g. a structural two-dimensional layer, e.g. a graphene layer) and the remaining material 407b of the annealed layer stack 407a, wherein the remaining material 407b may include the catalytic metal (412a, 412b) of the catalytic metal layers 204, 208 and the diffusion barrier material of the diffusion barrier layer 414. Method 100 in such a way may enhance the feature of method 100, that the remaining material 407b may be free of (or substantially free of) carbide phases and/or of material from the source layer 206, e.g. such that the remaining material 407b covering the interface layer 210 (e.g. the structural two-dimensional layer, e.g. the graphene layer) may be easily removed, for example using a single etch process 150.

Method 100 for processing a carrier, as described herein, may include annealing a layer stack, the layer stack including a source layer 206 (e.g. including a source material 206) and one or more catalytic metal layers (e.g. the one or more catalytic metal layers including a catalytic metal with respect to the source material 206), wherein the source layer 206 may be arranged within the layer stack such that the distance from the source layer 206 to the surface 202a of the carrier 202 may be smaller than the distance from the source layer 206 to the surface 207s, 407s of the layer stack 207a, 407a. Therefore, the source material 206 may segregate asymmetrically during an annealing process and/or after the annealing process has been carried out, such that a material having a two-dimensional crystal structure (e.g. graphene, e.g. silicene, e.g. germanene) may be formed at the surface 202a of the carrier 202 forming an interface layer 210 between the carrier 202 and the remaining (annealed) layer stack 207b, 407b.

The layer stack 207a, 407a may include additional layers, e.g. additional layers including catalytic material, or other materials influencing the segregation and/or diffusion process of the source material, e.g. additional barrier layers or diffusion layers assisting or controlling the diffusion of the source material (not shown).

Figure 6:
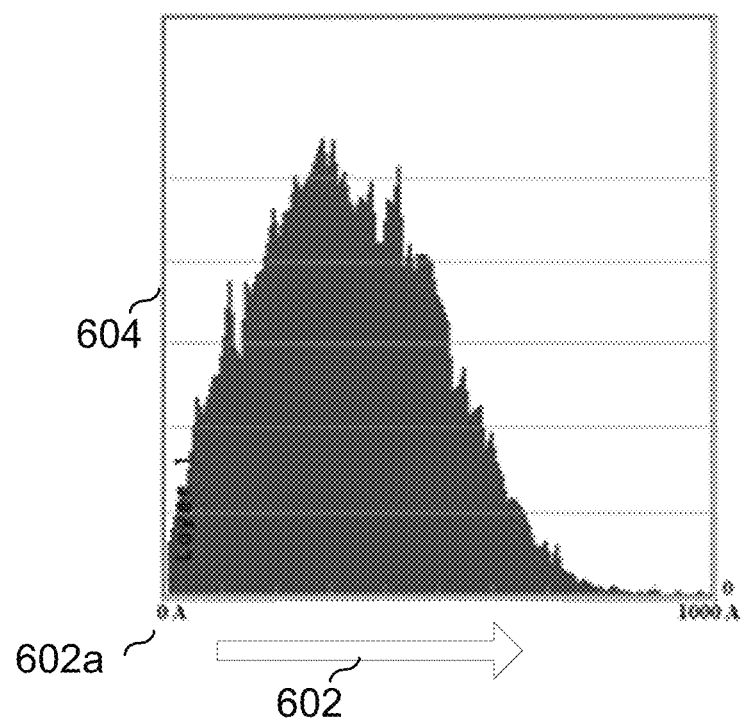
FIG. 6 shows an exemplary ion implantation profile of carbon being implanted into a nickel bulk material.

Method 100 for processing a carrier, as described herein, may include annealing a layer stack 207a, 407a, the layer stack 207a, 407a including a source layer 206 (e.g. including a source material 206) and one or more catalytic metal layers (e.g. including a catalytic metal with respect to the source material 206), wherein the source layer 206 may be arranged within the layer stack in a desired region, wherein the source layer 206, in contrast to methods (including for example ion-implantation of the source material), may be well-defined within the layer stack. A commonly used ion-implantation process for introducing a source material into a catalytic metal layer may cause a broad statistical distribution of the source material, depending on the statistical behavior of the implantation depth for the implanted ions, as shown in FIG. 6. Further, a commonly used ion-implantation process for introducing a source material into a catalytic metal layer may or a diffusion process diffusing carbon into a catalytic metal layer may result in providing the source material at the surface of the catalytic metal layer, which may cause for example the formation of graphene on the surface of the catalytic metal layer and/or the formation of metal carbide phases.

FIG. 6 illustrates a typical ion implantation profile for carbon ions being implanted into a nickel layer. The concentration of implanted carbon ions 604 depending on the corresponding implantation depth 602 may be statistically distributed. Therefore, the source material may be located near the surface 602a of the nickel layer, such that the source material may segregate at the surface of the nickel layer after an annealing process has been carried out. In contrast, using method 100 as described herein, the source material may be located in a well-defined position within the catalytic metal layer, e.g. near the surface of the carrier 202, such that the source material may segregate at the surface of the carrier 202, wherein the catalytic metal layer may be completely removed after the annealing process.

According to various embodiments, a method for processing a carrier may include: forming a first catalytic metal layer over a carrier; forming a source layer over the first catalytic metal layer (the source layer including a source material); forming a second catalytic metal layer over the source layer, wherein the thickness of the second catalytic metal layer may be larger than the thickness of the first catalytic metal layer; and subsequently performing an anneal to enable diffusion of the material (the source material) of the source layer forming an interface layer adjacent to the surface of the carrier from the diffused material of the source layer.

Further, according to various embodiments, forming a source layer may include forming a layer including at least one material of the following group of materials, the group consisting of: carbon, silicon, and germanium.

Further, according to various embodiments, forming a first catalytic metal layer may include forming a transition metal layer. Further, according to various embodiments, forming a first catalytic metal layer may include forming a layer including at least one material of the following group of materials, the group consisting of: nickel, cobalt, iron, ruthenium, rhodium, platinum, and iridium.

Further, according to various embodiments, forming a second catalytic metal layer may include forming a transition metal layer. Further, according to various embodiments, forming a second catalytic metal layer may include forming a layer including at least one material of the following group of materials, the group consisting of: nickel, cobalt, iron, ruthenium, rhodium, platinum, and iridium.

Further, according to various embodiments, the first catalytic metal layer may be formed from the same material as the second catalytic metal layer.

According to various embodiments, the method for processing a carrier may further include removing a remaining catalytic metal layer after the anneal has been performed (e.g. removing the remaining layer stack after the annealing process has been carried out) exposing the interface layer.

According to various embodiments, the method for processing a carrier may further include forming a diffusion barrier layer between the source layer and the second catalytic metal layer. Further, according to various embodiments, forming a diffusion barrier layer may include forming a layer including at least one material of the following group of materials, the group consisting of: copper, gold, silver, tantalum, titanium nitride, and silicon nitride.

According to various embodiments, the method for processing a carrier may further include removing the diffusion barrier layer of the annealed carrier exposing the interface layer, e.g. using an etch process.

According to various embodiments, the method for processing a carrier may further include patterning the carrier before the first catalytic metal layer is formed. In other words, the method, as described herein, may be performed using a patterned or already processed carrier.

According to various embodiments, the method for processing a carrier may further include adapting the thickness of the catalytic metal layers, the thickness of the source layer, and the anneal such that a conformal monolayer may be formed during performing the anneal, the monolayer having a two-dimensional lattice structure. According to various embodiments, examples for a monolayer having a two-dimensional lattice structure may be graphene, silicene, germanene, and for example hydrogenated graphene or graphane.

According to various embodiments, the method 100 for processing a carrier 202 may further include adapting the thickness of the catalytic metal layers, the thickness of the source layer, and the anneal such that a plurality of conformal monolayers may be formed during performing the anneal, each monolayer of the plurality of conformal monolayers having a two-dimensional lattice structure.

Further, according to various embodiments, performing an anneal may include performing the anneal in a hydrogen atmosphere. Further, according to various embodiments, performing an anneal may include performing the anneal in a hydrogen containing atmosphere.

According to various embodiments, the anneal may be performed in the presence of hydrogen.

According to various embodiments, the anneal may be performed in a gas atmosphere, the gas atmosphere may include hydrogen.

According to various embodiments, the hydrogen may be provided by incorporating hydrogen into at least one layer of the catalytic metal layers.

According to various embodiments, the hydrogen may be provided by incorporating hydrogen into the first catalytic metal layer, e.g. during forming the first catalytic layer.

According to various embodiments, the hydrogen may be provided by incorporating hydrogen into the second catalytic metal layer, e.g. during forming the second catalytic layer.

According to various embodiments, the hydrogen may be provided by incorporating hydrogen into the source layer, e.g. during forming the source layer.

According to various embodiments, the hydrogen may be provided by incorporating hydrogen, e.g. during a deposition process, into at least one of the following layers: the source layer, the first catalytic layer, and the second catalytic layer.

According to various embodiments, the method for processing a carrier may further include incorporating hydrogen into at least one layer of the catalytic metal layers.

According to various embodiments, the method for processing a carrier may further include incorporating hydrogen into the first catalytic metal layer.

According to various embodiments, the method for processing a carrier may further include incorporating hydrogen into the second catalytic metal layer.

According to various embodiments, the method for processing a carrier may further include incorporating hydrogen into the source layer.

According to various embodiments, hydrogen may be incorporated into the material being deposited forming the first catalytic metal layer and/or the second catalytic metal layer.

Further, according to various embodiments, the first catalytic metal layer may be formed over an electrically insulating carrier. In other words, the carrier may be an electrically insulating carrier or may include at least an electrically insulating surface layer.

Further, according to various embodiments, the first catalytic metal layer may be formed over a silicon dioxide surface layer. In other words, the carrier may be a silicon dioxide carrier or may include at least a silicon dioxide surface layer.

According to various embodiments, a method for processing a carrier may include forming a first region over a carrier including a catalytic material 204, forming a second region over the first region, the second region including a material to be diffused (e.g. a source material being capable of forming a two-dimensional lattice structure), forming a third region over the second region, the third region including the same catalytic material as the first region, wherein the thickness of the first region is smaller than the thickness of the third region, and subsequently performing an anneal such that the material (the source material) of the second region diffuses forming an interface layer adjacent to the surface of the carrier, the material of the interface layer including a two-dimensional lattice structure.

According to various embodiments, an electronic component may include: an electrically insulating patterned base layer providing a three-dimensional surface structure; a conformal layer disposed over the patterned base layer, the conformal layer being a monolayer of a material having a two-dimensional lattice structure, wherein the conformal layer enables a spatially confined charge carrier transport along the surface of the patterned base layer.

Further, according to various embodiments, the conformal layer may enable a spatially confined charge carrier transport in a region smaller than 1 nm along at least one spatial direction.

Further, according to various embodiments, the conformal layer and the patterned base layer may be configured to introduce at least one of internal stress and internal strain in the conformal layer, thereby changing the physical properties of the material having a two-dimensional lattice structure.

Further, according to various embodiments, the patterned base layer may include a plurality of recesses, the plurality of recesses forming the three-dimensional surface structure.

Further, according to various embodiments, the patterned base layer may include a plurality of structure elements, the plurality of structure elements forming the three-dimensional surface structure.

Further, according to various embodiments, the patterned base layer may be a patterned carrier.

Further, according to various embodiments, the material having a two-dimensional lattice structure may include at least one material of the following group of materials, the group consisting of: graphene, hydrogenated graphene; silicene; hydrogenated silicene; germanene; hydrogenated germanene (germanane).

According to various embodiments, an electronic component may include: an electrically insulating patterned base layer providing a three-dimensional surface structure; a conformal layer disposed over the patterned base layer, the conformal layer may include a plurality of monolayers, each monolayer of the plurality of monolayers may have a two-dimensional lattice structure, wherein the conformal layer may enable a spatially confined charge carrier transport along the surface of the patterned base layer.

Further, according to various embodiments, the conformal layer may include two monolayers arranged on top of each other.

According to various embodiments, performing an anneal may include annealing the layer stack arranged over the carrier.

According to various embodiments, a method for processing a carrier may include: forming a first catalytic metal layer over a carrier; forming a carbon layer over the first catalytic metal layer; forming a second catalytic metal layer over the source layer, wherein the thickness of the second catalytic metal layer may be larger than the thickness of the first catalytic metal layer; and subsequently performing an anneal to enable diffusion of the carbon of the carbon layer forming an interface layer adjacent to the surface of the carrier, the interface layer including one or more graphene sheets.

According to various embodiments, a method for processing a carrier may include forming a first region over a carrier including a catalytic material, forming a second region over the first region, the second region including carbon to be diffused (carbon is capable of forming a two-dimensional lattice structure, e.g. graphene), forming a third region over the second region, the third region including the same catalytic material as the first region, wherein the thickness of the first region may be smaller than the thickness of the third region, and subsequently performing an anneal such that the carbon of the second region diffuses forming a graphene layer adjacent to the surface of the carrier.

According to various embodiments, an electronic component may include an electrically insulating patterned base layer providing a three-dimensional surface structure; a conformal graphene monolayer disposed over the patterned base layer, the conformal graphene monolayer may enable a spatially confined charge carrier transport along the surface of the patterned base layer. According to various embodiments, an electronic component may include an electrically insulating patterned base layer providing a three-dimensional surface structure; a conformal graphene bilayer disposed over the patterned base layer, the conformal graphene bilayer may provide a channel for a transistor structure.

According to various embodiments, an electronic component may include: an electrically insulating patterned base layer providing a three-dimensional surface structure; a conformal layer disposed over the patterned base layer, the conformal layer may include a plurality of graphene monolayers, wherein the conformal graphene monolayers enable a spatially confined charge carrier transport along the surface of the patterned base layer.

According to various embodiments, each monolayer of a plurality of monolayers may be aligned to the surface of the carrier such that the basal plane of each monolayer may be parallel to the underlying surface of the carrier.

According to various embodiments, exposing the structural two-dimensional material layer or the layer being formed at the surface of the carrier including a structural two-dimensional material may be necessary for manufacturing for example sensors and/or transistors.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An electronic component, comprising:
   an electrically insulating patterned base layer providing a three-dimensional surface structure; and
   a conformal layer disposed over the patterned base layer, the conformal layer being a monolayer of a material having a two-dimensional lattice structure, wherein the conformal layer enables a spatially confined charge carrier transport along a surface of the patterned base layer, the material having a two-dimensional lattice structure comprising graphene.

2. The electronic component of claim 1,
   wherein the conformal layer enables a spatially confined charge carrier transport in a region smaller than 1 nm along at least one spatial direction.

3. The electronic component of claim 1,
   wherein the conformal layer and the patterned base layer are configured to introduce an internal stress in the conformal layer changing the physical properties of the material having a two-dimensional lattice structure.

4. The electronic component of claim 1,
   wherein the patterned base layer comprises a plurality of recesses, the plurality of recesses forming the three-dimensional surface structure.

5. The electronic component of claim 1,
   wherein the patterned base layer comprises a plurality of structure elements, the plurality of structure elements forming the three-dimensional surface structure.

6. The electronic component of claim 1,
   wherein the patterned base layer comprises a patterned wafer.

7. The electronic component of claim 1,
   wherein the monolayer is aligned with its basal plane parallel to the surface of the patterned base layer.

8. The electronic component of claim 1,
   wherein the monolayer is disposed directly on the surface of the patterned base layer.

9. An electronic component, comprising:
   an electrically insulating patterned base layer providing a three-dimensional surface structure; and
   a conformal layer disposed over the patterned base layer, the conformal layer comprising a plurality of monolayers, each monolayer of the plurality of monolayers having a two-dimensional lattice structure, wherein the conformal layer enables a spatially confined charge carrier transport along a surface of the patterned base layer, wherein each monolayer of the plurality of monolayers is formed of graphene.

10. The electronic component of claim 9,
    wherein the plurality of monolayers is two or three monolayers arranged on top of each other.

11. The electronic component of claim 9,
    wherein the patterned base layer comprises a patterned wafer.

12. The electronic component of claim 9,
    wherein the patterned base layer comprises a plurality of recesses, the plurality of recesses forming the three-dimensional surface structure.

13. The electronic component of claim 9,
    wherein the patterned base layer comprises a plurality of structure elements, the plurality of structure elements forming the three-dimensional surface structure.

14. The electronic component of claim 9,
    wherein each monolayer of the may be aligned with its basal plane parallel to the surface of the patterned base layer.

15. The electronic component of claim 9,
    wherein the conformal layer is disposed directly on the surface of the patterned base layer.

16. An electronic component, comprising:
    a patterned base layer providing a three-dimensional surface structure, wherein the patterned base layer is electrically insulating; and
    a graphene monolayer or a graphene bilayer disposed directly on the patterned base layer, wherein the graphene monolayer or the graphene bilayer conformally covers the three-dimensional surface structure.

17. The electronic component of claim 16,
    wherein the patterned base layer comprises a plurality of recesses, the plurality of recesses forming the three-dimensional surface structure.

18. The electronic component of claim 16,
    wherein the patterned base layer comprises a plurality of structure elements, the plurality of structure elements forming the three-dimensional surface structure.

* * * * *